United States Patent
Chen

(10) Patent No.: US 9,231,615 B2
(45) Date of Patent: Jan. 5, 2016

(54) METHOD TO SHORTEN HASH CHAINS IN LEMPEL-ZIV COMPRESSION OF DATA WITH REPETITIVE SYMBOLS

(71) Applicant: Seagate Technology LLC, Cupertino, CA (US)

(72) Inventor: Ning Chen, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 386 days.

(21) Appl. No.: 13/659,036

(22) Filed: Oct. 24, 2012

(65) Prior Publication Data

US 2014/0114937 A1 Apr. 24, 2014

(51) Int. Cl.
*G06F 17/30* (2006.01)
*G06F 7/00* (2006.01)
*H03M 7/30* (2006.01)

(52) U.S. Cl.
CPC .................................. *H03M 7/3084* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,247,638 A * | 9/1993 | O'Brien et al. | | 710/68 |
| 5,371,499 A * | 12/1994 | Graybill et al. | | 341/51 |
| 5,933,104 A * | 8/1999 | Kimura | | 341/87 |
| 5,951,623 A | 9/1999 | Reynar et al. | | 708/203 |
| 5,978,795 A * | 11/1999 | Poutanen et al. | | 1/1 |
| 6,021,198 A | 2/2000 | Anigbogu et al. | | 380/9 |
| 6,141,421 A * | 10/2000 | Takaragi et al. | | 380/30 |
| 6,594,665 B1 * | 7/2003 | Sowa et al. | | 1/1 |
| 7,451,166 B2 * | 11/2008 | Damani et al. | | 1/1 |
| 7,483,426 B2 * | 1/2009 | Claseman | | 370/392 |
| RE41,152 E | 2/2010 | Reynar et al. | | 8/203 |
| 7,724,974 B2 * | 5/2010 | Koziarz | | 382/244 |
| 7,792,810 B1 * | 9/2010 | Kaminski, Jr. | | 707/705 |
| 7,966,424 B2 * | 6/2011 | Abdo et al. | | 709/247 |
| 8,493,249 B2 * | 7/2013 | Mickle | | 341/107 |
| 8,661,428 B2 * | 2/2014 | Clark | | 717/170 |
| 2002/0108107 A1 * | 8/2002 | Darnell et al. | | 717/153 |
| 2003/0030575 A1 * | 2/2003 | Frachtenberg et al. | | 341/51 |
| 2012/0246163 A1 * | 9/2012 | Liu et al. | | 707/737 |

OTHER PUBLICATIONS

Ziv, Jacob, et al., "A Universal Algorithm for Sequential Data Compression", IEEE Transaction on Information Theory, vol. IT-23, No. 3, May 1997, pp. 337-343.

* cited by examiner

*Primary Examiner* — Daniel Kuddus
(74) *Attorney, Agent, or Firm* — Christopher P. Maiorana, PC

(57) ABSTRACT

An apparatus having a circuit is disclosed. The circuit may be configured to (i) generate a sequence of hash values in a table from a stream of data values with repetitive values, (ii) find two consecutive ones of the hash values in the sequence that have a common value and (iii) create a shortened hash chain by generating a pointer in the table at an intermediate location that corresponds to a second of the two consecutive hash values. The pointer generally points forward in the table to an end location that corresponds to a last of the data values in a run of the data values.

18 Claims, 5 Drawing Sheets

US 9,231,615 B2

METHOD TO SHORTEN HASH CHAINS IN LEMPEL-ZIV COMPRESSION OF DATA WITH REPETITIVE SYMBOLS

The present application is related to U.S. application Ser. No. 13/464,433, filed May 4, 2012, which is incorporated by reference.

FIELD OF THE INVENTION

The present invention relates to hash chains generally and, more particularly, to a method and/or apparatus to shorten hash chains in Lempel-Ziv compression of data with repetitive symbols.

BACKGROUND OF THE INVENTION

A Lempel-Ziv compression technique searches for recurring data patterns in a stream of bytes. However, performing the matching at all bytes of the stream is slow. A conventional approach to improve the compression throughput uses chains of hash values. Hash chains help the compression technique process sequences with the same hash value to find potential matches. A symbol run present in the stream generates a long hash chain that slows the compression.

Referring to FIG. 1, a diagram of a portion of a conventional hash chain 10 is shown. The diagram illustrates a portion of the normal hash chain 10 relative to sequential locations 0-C. Each location 1-4, 8 and 9 contains a given hash value (white). Locations 0, 5-7 and A-C contain different hash values (shaded). The normal hash chain 10 is created by setting pointers in each given hash value locations 1-4, 8 and 9 to a nearest previous given hash value location. Therefore, long byte runs create long hash chains having many pointers for the compression technique to consider.

It would be desirable to implement a method to shorten hash chains in Lempel-Ziv compression of data with repetitive symbols.

SUMMARY OF THE INVENTION

The present invention concerns an apparatus having a circuit. The circuit may be configured to (i) generate a sequence of hash values in a table from a stream of data values with repetitive values, (ii) find two consecutive ones of the hash values in the sequence that have a common value and (iii) create a shortened hash chain by generating a pointer in the table at an intermediate location that corresponds to a second of the two consecutive hash values. The pointer generally points forward in the table to an end location that corresponds to a last of the data values in a run of the data values.

The objects, features and advantages of the present invention include providing hash chains in Lempel-Ziv compression of data with repetitive symbols that may (i) shorten the hash chains, (ii) parse through a run visiting only two nodes in a stream, (iii) parse through a run regardless of the run length, (iv) incur no extra storage penalty and/or (v) by implemented in an integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention may provide a hash chain construction technique (or apparatus or method) that shortens hash chains generated in a presence of data value runs in a stream of data values (e.g., bytes or symbols). A run is generally a sequence of two or more locations (or nodes) that have the same value. The shortened hash chains generally allow a Lempel-Ziv (e.g., LZ) compression search to process through the data value runs of any length quickly by visiting only a few (e.g., two) nodes. The shortened hash chains may also enable the LZ compression search to compare the runs by lengths, instead of through byte-by-byte comparisons. No extra storage costs may be incurred by the shortened hash chains when compared with classical hash chains.

The hash chain construction technique may group consecutive identical (or common) data values into a single node. Branches may be added to the chain by the technique when grouping. Therefore, the shortened hash chain may be considered a tree. Tracing into a run generally uses only a single node of a second data value (or a second byte or symbol). Tracing out of the run may use another node of an initial data value (or an initial byte or symbol). A pointer (or chain value) of the second node may point forward and may be the only type of pointer to point forward. In classical has chains, all pointers point backward. Therefore, the pointer of the second node generally provides multiple (e.g., three) pieces of information: that the node is the second data value of a run; a length of the run; and an implicit pointer to an initial (or first) node of the run.

Figure 2:
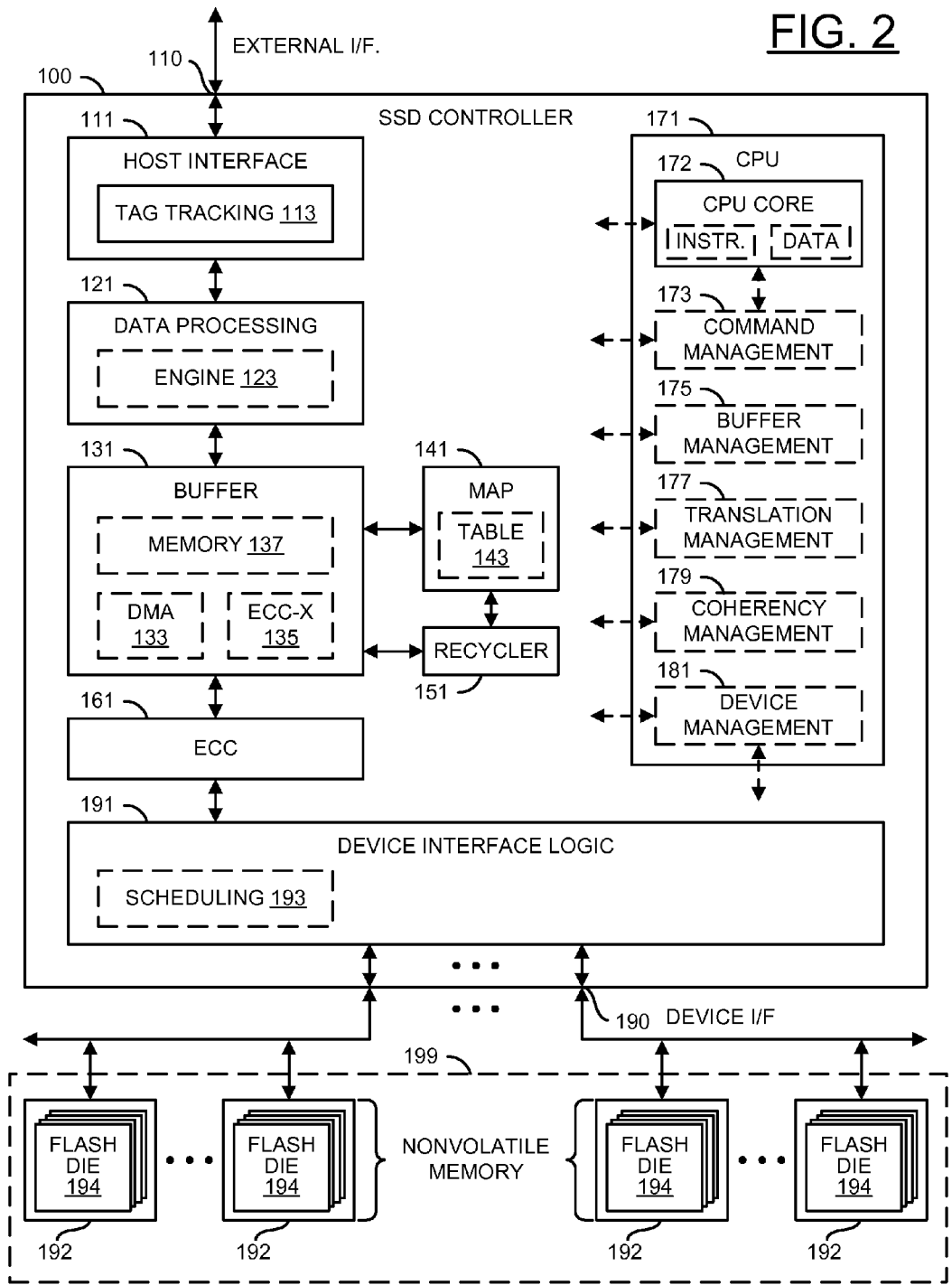
FIG. 2 is block diagram of an example implementation of a memory controller.

Referring to FIG. 2, a block diagram of an example implementation of an apparatus 100 is shown. The apparatus (or circuit, or system or integrated circuit) 100 may be implemented as a memory controller. In some embodiments of the present invention, the apparatus 100 may implement a solid state drive controller. The apparatus 100 generally controls a block (or circuit) 199. The circuit 199 may implement a nonvolatile memory circuit. In some embodiments, the circuit 199 may implement a solid state drive memory circuit. The circuits 100-199 may represent modules and/or blocks that may be implemented as hardware, software, a combination of hardware and software, or other implementations.

The circuit 100 may be communicatively coupled via one or more external interface (or ports) 110 to a host (e.g., a computer). The interfaces 110 may be implemented as one or more of: a serial AT attachment (e.g., SATA) interface; a serial attaches small computer system interface (e.g., SAS) interface; a peripheral component interconnect express (e.g., PCie) interface; a Fibre Channel interface; an Ethernet Interface (such as 10 Gigabit Ethernet); a nonstandard version of any of the preceding interfaces; a custom interface; or any other type of interface used to interconnect storage and/or communications and/or computing devices.

The circuit 100 may also be communicatively coupled via one or more device interfaces (or ports) 190 to the circuit 199. The circuit 199 generally includes one or more storage devices, such as one or more of flash device blocks (or circuits) 192. The interfaces 190 may be implemented as one or more of: an asynchronous interface; a synchronous interface; a single data rate (e.g., SDR) interface; a double data rate (e.g., DDR) interface; a dynamic random access memory (e.g., DRAM) compatible DDR or DDR2 synchronous interface; an open NAND flash interface (e.g., ONFI) compatible interface, such as an ONFI 2.2 or ONFI 3.0 compatible interface; a toggle-mode compatible flash interface; a nonstandard version of any of the preceding interfaces; a custom interface; or any other type of interface used to connect to storage devices.

Each circuit 192 generally includes one or more individual flash die (or circuits) 194. Multiple circuits 194 may be optionally and/or selectively accessible in parallel. The circuit 192 may be configured to couple to circuit 100 communicatively. Any type of storage device may be implemented in the circuit 192, such as a single-level cell (e.g., SLC) NAND flash memory, a multi-level cell (e.g., MLC) NAND flash memory, a NOR flash memory, flash memory using polysilicon or silicon nitride technology-based charge storage cells, two-dimensional or three-dimensional technology-based flash memory, read-only memory (e.g., ROM), static random access memory (e.g., SRAM), dynamic random access memory (e.g., DRAM), ferromagnetic memory, phase-change memory, racetrack memory, resistive RAM (e.g., ReRAM), or any other type of memory device or storage medium.

The interfaces 190 are generally organized as: one or more busses with one or more of the circuits 192 per bus; one or more groups of busses with one or more of the circuits 192 per bus, where busses in a group are generally accessed in parallel; or any other organization of one or more of circuits 192 onto the interfaces 190.

The circuit 100 generally includes one or more blocks, such as host interface blocks (or circuits) 111, data processing blocks (or circuits) 121, a buffer block (or circuit) 131, a map block (or circuit) 141, a recycler block (or circuit) 151, an error correction code (e.g., ECC) block (or circuit) 161, a device interface logic block (or circuit) 191, and a central processing unit (e.g., CPU) block (or circuit) 171.

The circuits 111 generally send and receive commands and/or data via the interfaces 110, and may track progress of individual commands via a tag tracking block (or circuit) 113. The commands may include a read command specifying an address (such as a logical block address (e.g., LBA)) and an amount of data (such as a number of LBA quanta or sectors) to read. In response to the read command, the circuit 100 may provide read status and/or read data. The commands may also include a write command specifying an address (such as an LBA) and an amount of data (such as a number of LBA quanta or sectors) to write. In response to the write command, the circuit 100 generally provides a write status and/or requests write data and optionally subsequently provides write status. The commands may include a deallocating command (e.g., a trim command) specifying one or more addresses (such as one or more LBAs) that should no longer be allocated. In response to the deallocating command, the circuit 100 may modify the map accordingly and optionally provides a deallocating status.

The circuit 121 may optionally and/or selectively process some or all of the data sent between the circuit 131 and the interfaces 110. The circuit 121 may optionally and/or selectively process data stored in the circuit 131. The circuit 121 generally uses one or more engine blocks (or circuits) 123 to perform one or more of: formatting; reformatting; transcoding; and any other data processing and/or manipulation task.

The circuit 131 may store data sent to/from interfaces 110 and from/to the interfaces 190. The circuit 131 may additionally store system data, such as some or all map tables, used by the circuit 100 to manage one or more of the circuits 192. The circuit 131 generally includes one or more of: a memory block (or circuit) 137 used for temporary storage of data; a direct memory access (e.g., DMA) block (or circuit) 133 used to control movement of data to and/or from circuit 131; and an ECC-X block (or circuit) 135 used to provide higher-level error correction and/or redundancy functions; and other data movement and/or manipulation functions.

The circuit 161 may optionally and/or selectively processes some or all data sent between the circuit 131 and interfaces 190. The circuit 161 may optionally and/or selectively processes data stored in the circuit 131. The circuit 161 may be configured to provide lower-level error correction and/or redundancy functions, such as in accordance with one or more ECC techniques. The circuit 161 may implement one or more of: a cyclic redundancy check (e.g., CRC) code; a Hamming code; an Reed-Solomon (e.g., RS) code; a Bose, Ray-Chaudhuri and Hocquenghem (e.g., BCH) code; an low density parity check (e.g., LDPC) code; a Viterbi code; a trellis code; a hard-decision code; a soft-decision code; an erasure-based code; any error detecting and/or correcting code; and any combination of the preceding. The circuit 161 may include one or more decoders, such as low density parity check decoders.

The circuit 191 generally controls instances of the circuit 192 via the interfaces 190. The circuit 191 may be configured to send data to/from the instances of the circuit 192 according to a protocol of the circuit 192. The circuit 191 generally includes a scheduling block (or circuit) 193 to selectively sequence control of the instances of the circuit 192 via the interfaces 190. The circuit 193 may be configured to queue operations to the instances of the circuit 192, and to selectively send the operations to the individual instances of circuit 192 (or circuit 194) when available.

The circuit 141 may be configured to convert between data addressing used on the interfaces 110 and data addressing used on the interfaces 190, using a table block (or circuit) 143 to map external data addresses to locations in the circuit 199. The circuit 141 may convert LBAs used on the interfaces 110 to block and/or page addresses targeting one or more of the circuits 194, via mapping provided by the table 143. For LBAs that have never been written since drive manufacture or deallocation, the circuit 141 generally points to a default value to return if the LBAs are read. For example, when processing a deallocating command, the circuit 141 may be modified so that entries corresponding to the deallocated LBAs point to a default value. Various default values may be implemented, each having a corresponding pointer. The default values generally enable reading some deallocated LBAs (such as in an initial range) as a particular default value, while reading other deallocated LBAs (such as in a subsequent range) as another default value. The default values may be defined by flash memory, hardware, firmware, command and/or primitive arguments and/or parameters, programmable registers, or various combinations thereof.

The circuit 141 is generally configured to use the table 143 to perform and/or to look up translations between addresses used on the interfaces 110 and data addressing used on the interfaces 190. The table 143 may be implemented as one or more of: a one-level map; a two-level map; a multi-level map; a map cache; a compressed map; any type of mapping from one address space to another; and any combination of the foregoing. The table 143 generally includes one or more of: static random access memory; dynamic random access memory; nonvolatile memory (such as flash memory); cache memory; on-chip memory; off-chip memory; and any combination of the foregoing.

In some embodiments, the circuit 151 generally performs garbage collection. For example, instances of the circuit 192 may contain blocks that should be erased before the blocks are re-writeable. The circuit 151 may be configured to determine which portions of the instances of the circuit 192 are actively in use (e.g., allocated instead of deallocated), such as by scanning a map maintained by the circuit 141, and to make unused (e.g., deallocated) portions of the instances of circuit 192 available for writing by erasing the portions. The circuit 151 may also be configured to move data stored within instances of circuit 192 to make larger contiguous portions of the instances of circuit 192 available for writing.

The circuit 192 may be configured to selectively and/or dynamically configured, managed, and/or used to have one or more bands for storing data of different types and/or properties. A number, arrangement, size, and type of the bands may be dynamically changeable. For example, data from a computing host may be written into a hot (e.g., active) band, while data from the circuit 151 may be written into a cold (e.g., less active) band. In some usage scenarios, if the computing host writes a long sequential stream, a size of the hot band may grow, whereas if the computing host does random writes or few writes, a size of the cold band may grow.

The circuit 171 may be configured to control various portions of the circuit 100. The circuit 171 generally includes a CPU core block (or circuit) 172. The circuit 172 may be implemented as one or more single-core and/or multi-core processors. Some or all of the individual processors cores in the circuit 172 may be multi-threaded. The circuit 172 generally includes instruction and/or data caches and/or memories. For example, the instruction memory may contain instructions to enable the circuit 172 to execute programs (e.g., program instructions, software and/or firmware) to control the circuit 100. Some or all of the instructions executed by the circuit 172 may be stored on instances of circuit 192.

The circuit 171 may include a command management block (or circuit) 173 to track and control commands received via interfaces 110 while the commands are in progress; a buffer management block (or circuit) 175 to control allocation and use of the circuit 131; a translation management block (or circuit) 177 to control the circuit 141; a coherency management block (or circuit) 179 to control consistency of data addressing and to avoid conflicts such as between external data accesses and recycle data accesses; a device management block (or circuit) 181 to control the circuit 191; an identity management block (or circuit) 182 to control modification and communication of identify information, and optionally other management units.

The circuit 171 is generally configured to perform other management tasks, such as one or more of: gathering and/or reporting performance statistics; controlling power sequencing, controlling and/or monitoring and/or adjusting power consumption; responding to power failures; controlling and/or monitoring and/or adjusting clock rates; and other management tasks.

The host may include one or more of a computer, a workstation computer, a server computer, a storage server, a storage area network (e.g., SAN), a network area storage (e.g., NAS) device, a direct-attached storage (e.g., DAS) device, a storage appliance, a personal computer, a laptop computer, a notebook computer, a netbook computer, a tablet device or computer, an ultrabook computer, an electronic reading device (such as an e-reader), a personal digital assistant, a navigation system, a (handheld) global positioning satellite receiver device, an automotive control system, an automotive media control system or computer, a printer, copier or fax machine or all-in-one device, a point of sale (e.g., POS) device, a cash register, a media player, a television, a media recorder, a digital video recorder, a digital camera, a cellular handset, a cordless telephone handset, and an electronic game.

The circuit 100 may be implemented on a single integrated circuit (e.g., IC), a single die of a multi-die IC, a plurality of die of a multi-die IC, or a plurality of ICs. For example, the circuit 131 may be implemented on a same die as other elements of the circuit 100. For another example, the circuit 131 may be implemented on a different die than other elements of the circuit 100. Additional details of the circuit 100 and the circuit 199 may be found in co-pending U.S. application Ser. No. 13/464,433, which is hereby incorporated by reference in its entirety.

Figure 3:
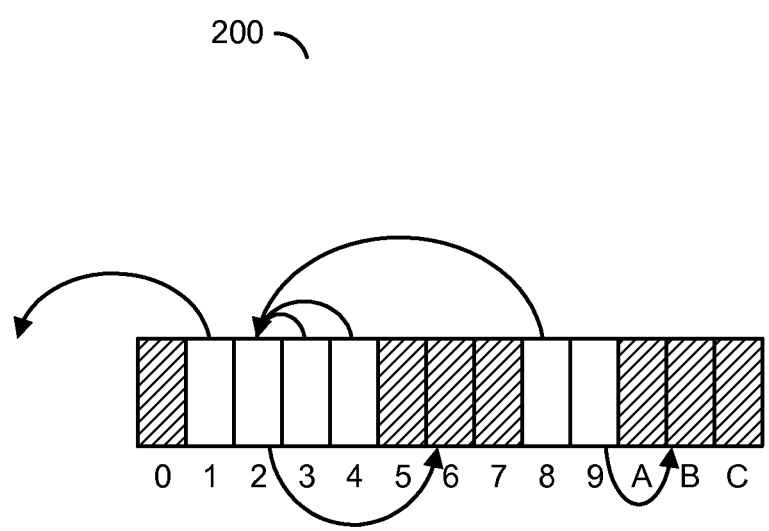
FIG. 3 is a diagram of a portion of a shortened hash chain.

Referring to FIG. 3, a diagram of a portion of a shortened hash chain 200 is shown. The shortened hash chain 200 may run across multiple sequential locations (e.g., locations 0-C). Each location 0-C may correspond to a respective hash value for multiple (e.g., 2 to 8) data values and a respective pointer (or chain value). Each pointer may either (i) point to another location having the same hash value or (ii) contain a default value (e.g., a zero value pointer).

Several rules may be used in creating the pointers. A pointer for a second location in a current run (or string) of common hash values may be created to point forward to an end (or final) location of the current run. Pointers for other locations in the current run having the common hash value may be created to all point back to the second location in the current run. After the current run has ended, a pointer of a next location having the common hash value may be set to point back to the second location of the now-ended current run.

Table I provides an example of a shortened hash chain table and a normal hash chain table based on a stream of data values as follows:

TABLE I

| | Locations | | | | | | | | | | | | |
|---|---|---|---|---|---|---|---|---|---|---|---|---|---|
| | 0 | 1 | 2 | 3 | 4 | 5 | 6 | 7 | 8 | 9 | A | B | C |
| Stream of Data Values | W | X | X | X | X | X | X | Y | X | X | X | X | Z |
| Corresponding Hashes | D | E | E | E | E | F | G | H | E | E | I | J | K |
| Normal Chain Table | −1 | −1 | 1 | 2 | 3 | −1 | −1 | −1 | 4 | 8 | −1 | −1 | −1 |
| Shortened Chain Table | −1 | −1 | 6 | 2 | 2 | −1 | −1 | −1 | 2 | B | −1 | −1 | −1 |

The stream of data values in the example generally includes: a value W; a run of 6 consecutive values X; a value Y; another run of 4 consecutive values X; and a value Z. The corresponding hash values may be calculated based on the data values in a current location and the next few (e.g., two) locations. For example, the hash value D may be calculated from the data values W, X and X (e.g., in the locations 0, 1 and 2, respectively). The (common) hash value E may be calculated based on three consecutive data values X. The hash value F may be calculated from the data values x, x and Y (e.g., in the locations 5, 6 and 7, respectively) and so on. Other numbers of data values may be used to calculate the hash values to meet the criteria of a particular application.

Figure 1:
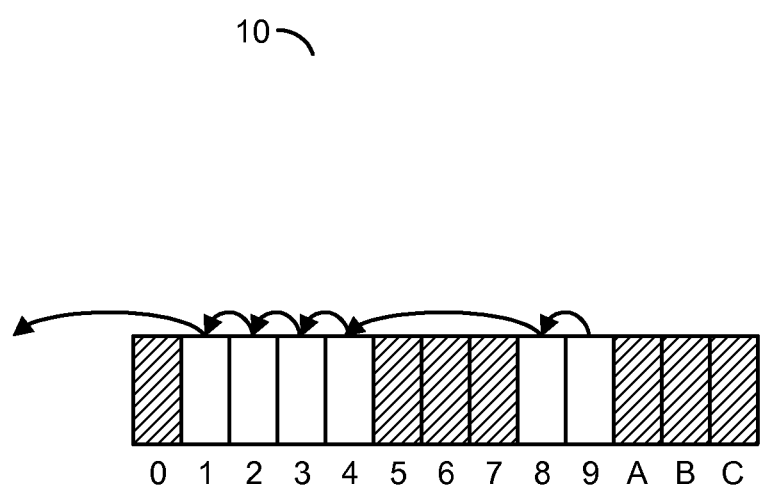
FIG. 1 is a diagram of a portion of a conventional hash chain.

In the normal chain table, each location having the common hash value E may point back to a nearest earlier location having the common hash value E. Thus, the pointer in the location 3 points back to the location 2; the pointer in location 4 points back to the location 3; the pointer in the location 8 points back to the location 4; and the pointer in the location 9 points back to the location 8. An example of the normal hash chain table is illustrated in FIG. 1.

For the initial run in the shortened chain table: the pointer of the location 1 may be set to the default (e.g., minus one) value; and the pointer of the location 2 may be set to point forward to the location 6 (e.g., the end location of the initial run). For the next run in the shortened chain table: the pointer of the location 8 may point backward to the location 2 (e.g., the second location of the initial run); and the pointer of the location 9 may be set to point forward to the location B (e.g., the end location of the next run). An example of the shortened hash chain table is generally illustrated in FIG. 3.

Figure 4:
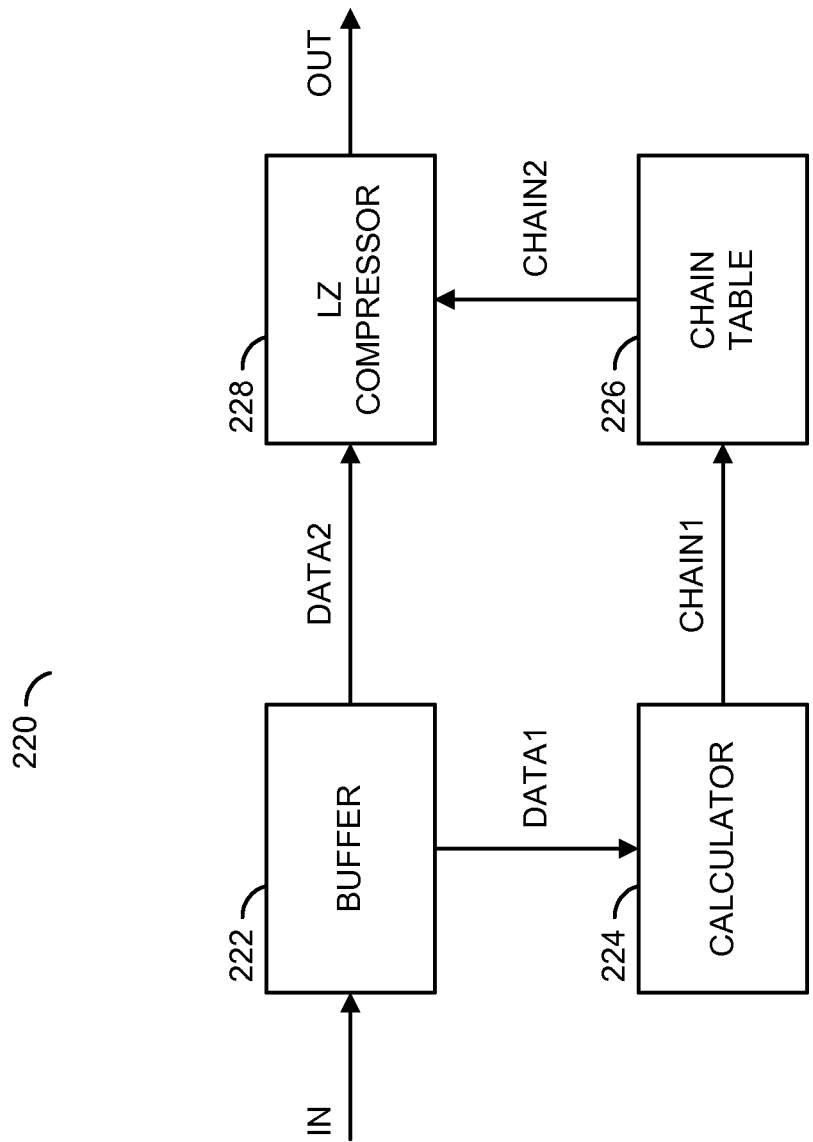
FIG. 4 is a block diagram of an example implementation of an apparatus in accordance with an embodiment of the present invention.

Referring to FIG. 4, a block diagram of an example implementation of an apparatus 220 is shown in accordance with an embodiment of the present invention. The apparatus (or circuit, or system, or integrated circuit) 220 may be implemented within the circuit 100. The apparatus 220 generally comprises a block (or circuit) 222, a block (or circuit) 224, a block (or circuit) 226 and a block (or circuit) 228. The circuits 222-228 may represent modules and/or blocks that may be implemented as hardware, software, a combination of hardware and software, or other implementations. In some embodiments, the circuits 222-228 may implemented as the circuits 121, 131 and/or 171.

A signal (e.g., IN) may be received by the circuit 222. The signal IN generally conveys a stream of data values having repetitive symbols. The circuit 222 may generate and present a signal (e.g., DATA1) to the circuit 224. A signal (e.g., DATA2) may also be generated by the circuit 222 and presented to the circuit 228. Each signal DATA1 and DATA2 may carry copies of the data values. The circuit 224 may generate and present a signal (e.g., CHAIN1) to the circuit 226. A signal (e.g., CHAIN2) may be generated by the circuit 226 and transferred to the circuit 228. Each signal CHAIN1 and CHAIN2 may carry pointers of a shorted hash chain.

The circuit 222 may implement a buffer circuit. The circuit 222 is generally operational to temporarily store the data values received in the signal IN. A copy of the data values may be presented in the signal DATA1 from the circuit 222 to the circuit 224. Another copy of the data values may be presented in the signal DATA2 from the circuit 222 to the circuit 228 in the signal DATA2.

The circuit 224 may implement a calculator circuit. The circuit 224 is generally operational to (i) generate a sequence of hash values, (ii) find two consecutive common hash values and (iii) create a shorted hash chain by generating one or more pointers. The hash values may be generated from the stream of data values received in the signal DATA1. The hash values may be stored in a table (e.g., stored in the circuit 226). Each hash value may be calculated from multiple (e.g., two or more) data values. The resulting hash values may be transferred in the signal CHAIN1 to the circuit 226. If two consecutive common hash values are found, a run of at least three consecutive same (repeated) data values generally exists in the signal IN. Therefore, a pointer may be generated in the circuit 226 at an intermediate (or second) location in the table that corresponds to a second of the consecutive common hash values (and the second of the consecutive same data values). The pointer may point forward in the table to an end location that corresponds to a last of the same data values in the data value run. In some embodiments, the circuit 224 may compare the consecutive data values (e.g., a byte-to-byte comparison) to ensure that a run of common data values exist in the signal DATA1.

The circuit 224 may be further operational to examine additional hash values in the run, if any. If a third consecutive common hash value is found, an additional pointer may be set in the table at an additional location corresponding to the third consecutive common hash value (and the third consecutive same data value). The additional pointer may point backward in the table to the intermediate location. The circuit 224 may continue examining more hash values and setting more pointers in the run backward to the intermediate location. The pointers may be transferred to the circuit 226 in the signal CHAIN1. When the end location of the last same data value is reached, the run may be considered at an end.

The circuit 226 may implement a chain table memory circuit. The circuit 226 is generally operational to store hash values and pointers of a shortened chain table created by the circuit 224. The pointers may be presented in the signal CHAIN2 from the circuit 226 to the circuit 228.

The circuit 228 may implement a compressor circuit. The circuit 228 is generally operational to compress the data values received in the signal DATA2 using the pointers received in the signal CHAIN2. The compressed information may be presented in the signal OUT. In some embodiments, the compression may be a LZ compression. Other compression techniques may be implemented to meet the criteria of a particular application.

Figure 5:
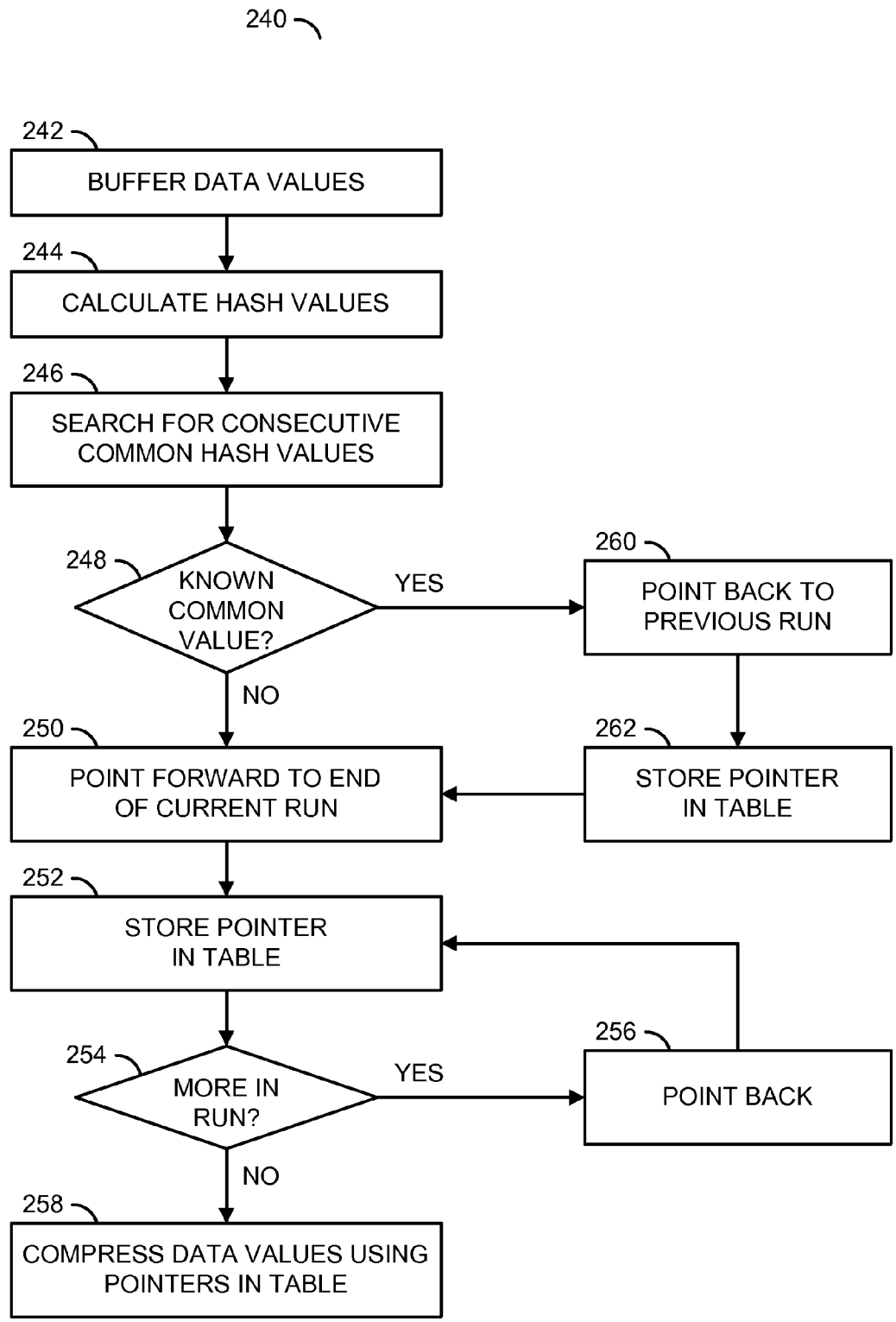
FIG. 5 is a flow diagram of an example implementation of a method for compressing a data stream.

Referring to FIG. 5, a flow diagram of an example implementation of a method 240 for compressing a data stream is shown. The method (or process) 240 may be implemented by the apparatus 220. The method 240 generally comprises a step (or state) 242, a step (or state) 244, a step (or state) 246, a step (or state) 248, a step (or state) 250, a step (or state) 252, a step (or state) 254, a step (or state) 256, a step (or state) 258, a step (or state) 260 and a step (or state) 262. The steps 242-262 may represent modules and/or blocks that may be implemented as hardware, software, a combination of hardware and software, or other implementations.

In the step 242, the circuit 222 may buffer a portion of the data values received in the signal IN. The circuit 224 may calculate the hash values in the step 244 based on the data values buffered in the circuit 222 and received in the signal DATA1. In the step 246, the circuit 224 may search for two or more consecutive hash values having a common (or same) hash value. The two or more consecutive common hash values generally indicate a run of three or more common data values. If a current run of the data values is found, the circuit 224 may check in the step 248 to see if the common hash value was previously found. For an initial find of the common hash value, the circuit 224 may generate a pointer (or chain value) in the second location of the current run to point to an end location of the current run during the step 250 (e.g., in FIG. 3 the pointer in the location 2 points to the location 6). The end location may be identified by counting a predetermined number of locations beyond a last location having the common hash value. For example, if the hash values are calculated using three data values (or nodes), the end location in the current run is two locations (2=3−1) beyond the last location having the common hash value. If the hash values are calculated using five data values (or nodes), the end location of the current run is four locations (4=5−1) beyond the last location having the common hash value. In the step 252, the pointer may be stored in a chain table held in the circuit 226.

The circuit 224 may check in the step 254 for more common hash values in the current run. For each subsequent hash value having the common value, the circuit 224 may generate a respective pointer for the respective location in the step 256. All respective pointers of the subsequent common hash values may point back to the second location in the current run (e.g., in FIG. 3 the pointers in the locations 3 and 4 each point back to the location 2). Each respective pointer may be stored in the chain table in the circuit 226. A loop around the steps 252-256 may continue until a pointer for the last common hash value in the current run has been stored in the chain table. After all of the pointers associated with the current run have been stored, the circuit 228 may compress the data values received in the signal DATA2 using the hash chain received in the signal CHAIN2 from the chain table.

If the common hash value found in the current run is a repeat of a previous common hash value of a previous run, the circuit 224 may generate a pointer in the first (or initial) location of the current run in the step 260. The pointer in the first location of the current run may point back to the second location of the previous run (e.g., in FIG. 3 the location 8 points back to the location 2). The pointer may then be stored in the chain table within the circuit 226 in the step 262. The method 240 may continue with the step 250 where the pointer of the second location in the current run is set to point forward to the end location of the current run.

Some embodiments of the present invention may group consecutive identical data values (or nodes) for a current run in a data stream into a single node (e.g., the second location) of a hash chain. The hash chain may branch when grouping so the hash chain may be treated as a tree. Tracing into the current run generally uses the single node (e.g., the second location). Tracing out of the current run to a previous run may use another node (e.g., the first location).

A pointer in the second location may point forward to an end location of the current run. The pointer in the second location may (i) indicate that a current run is in progress, (ii) specify a length of the current run and (iii) imply the position of a starting (or beginning) location of the current run (e.g., the first location). Tracing initiated inside the run is generally the sane as tracing into the run. Comparisons between runs simply align the ends of the runs, rather than performing the byte-by-byte comparisons as is commonly performed.

The functions performed by the diagrams of FIGS. 2-5 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a buffer configured to store a stream of data values having a run of three or more consecutive repeated data values;
    a table configured to store a plurality of pointers and associated hash values; and a circuit configured to (i) generate each of the hash values from two or more of the data values at two or more consecutive positions within the stream as stored in the buffer, (ii) find two or more of the hash values that have a common value and are consecutively located in the table, (iii) create a hash chain by setting the pointer at an intermediate location in the table to point forward to an end location in the table that corresponds to an end of the run, wherein the intermediate location stores a second of the two or more consecutively located hash values with the common value, and (iv) set the pointer at another location in the table that stores a fourth consecutive common value to point backward to the intermediate location in the table.

2. The apparatus according to claim 1, further comprising a compressor configured to compress the data values in the run using the pointer at the intermediate location in the table to identify both (i) a starting location of the run and (ii) the end location of the run.

3. The apparatus according to claim 2, wherein the compression comprises a Lempel-Ziv compression.

4. The apparatus according to claim 1, wherein the circuit is further configured to set the pointer at an additional location in the table that corresponds to another run that hashes to the common value to point backward to the intermediate location in the table.

5. The apparatus according to claim 4, wherein at least one of the hash values between the run and the another run is different than the common value.

6. The apparatus according to claim 1, wherein the circuit is further configured to calculate the end location in the table as a predetermined offset from a last location in the table that stores a last of the hash values in the run that has the common value.

7. The apparatus according to claim 1, wherein the intermediate location in the table stores the pointer and no more than one of the hash values.

8. The apparatus according to claim 1, wherein the circuit is further configured to compare the run with another run by aligning the end location of the run with another end location of the another run.

9. The apparatus according to claim 1, wherein the apparatus is implemented as one or more integrated circuits.

10. A method for creating a shortened hash chain, comprising the steps of:
  storing in a buffer a stream of data values having a run of three or more consecutive repeated data values;
  storing in a table a plurality of pointers and associated hash values;
  generating each of the hash values from two or more of the data values at two or more consecutive positions within the stream as stored in the buffer;
  finding two or more of the hash values that have a common value and are consecutively located in the table;
  creating the hash chain by setting the pointer at an intermediate location in the table to point forward to an end location in the table that corresponds to an end of the run, wherein the intermediate location stores a second of the two or more consecutively located hash values with the common value; and
  setting the pointer at another location in the table that stores a fourth consecutive common value to point backward to the intermediate location in the table.

11. The method according to claim 10, further comprising the step of:
  compressing the data values in the run using the pointer at the intermediate location in the table to identify both (i) a starting location of the run and (ii) the end location of the run.

12. The method according to claim 11, wherein the compressing comprises a Lempel-Ziv compression.

13. The method according to claim 10, further comprising the step of:
  setting the pointer at an additional location in the table that corresponds to another run that hashes to the common value to point backward to the intermediate location in the table.

14. The method according to claim 13, wherein at least one of the hash values between the run and the another run is different than the common value.

15. The method according to claim 10, further comprising the step of:
  calculating the end location in the table as a predetermined offset from a last location in the table that stores a last of the hash values in the run that has the common value.

16. The method according to claim 10, wherein the intermediate location in the table stores the pointer and no more than one of the hash values.

17. The method according to claim 10, further comprising the step of:
  comparing the run with another run by aligning the end location of the run with another end location of the another run.

18. An apparatus comprising:
  an interface configured to process a plurality of read/write operations to/from a nonvolatile memory;
  and a circuit configured to (i) store in a buffer a stream of data values having a run of three or more consecutive repeated data values (ii) store in a table a plurality of pointers and associated hash values, (iii) generate each of the hash values from two or more of the data values at two or more consecutive positions within the stream as stored in the buffer, (iv) find two of more of the hash values that have a common value and are consecutively located in the table and (v) create a hash chain by setting the pointer at an intermediate location in the table to point forward to an end location in the table that corresponds to an end of the run, wherein the intermediate location stores a second of the two or more consecutively located hash values with the common value, and (vi) set the pointer at another location in the table that stores a fourth consecutive common value to point backward to the intermediate location in the table.

* * * * *